US006437554B1

(12) United States Patent
Atwater et al.

(10) Patent No.: US 6,437,554 B1
(45) Date of Patent: Aug. 20, 2002

(54) HIGH CURRENT MEASUREMENT SYSTEM INCORPORATING AN AIR-CORE TRANSDUCER

(75) Inventors: Philip L. Atwater, Golden; James Dehaan, Denver; Malin L. Jacobs, Littleton, all of CO (US)

(73) Assignee: The United States of America as represented by the Secretary of the Interior, Washington, DC (US)

( * ) Notice: Subject to any disclaimer, the term of this patent is extended or adjusted under 35 U.S.C. 154(b) by 0 days.

(21) Appl. No.: 09/443,452

(22) Filed: Nov. 19, 1999

(51) Int. Cl.[7] ......................... G01R 19/08; G01R 33/06
(52) U.S. Cl. .............................. 324/117 R; 324/117 H
(58) Field of Search ................................ 324/234, 239, 324/543, 117 R, 117 H

(56) References Cited

U.S. PATENT DOCUMENTS 5,128,608 A * 7/1992 Ochi ........................ 324/117 R
5,502,373 A * 3/1996 Ryczek et al. ............ 324/117 R
6,064,192 A * 5/2000 Redmyer .................. 324/117 R

* cited by examiner

Primary Examiner—Glenn W. Brown
(74) Attorney, Agent, or Firm—Neil L. Mark

(57) ABSTRACT

An air-core current transducer measurement system is provided for measuring current flow in a high voltage transmission line. The system includes a high voltage end including an electrically conductive case for the circuitry at that end and an isolated low voltage end which is coupled by a fiber optic cable to the high voltage end and which provides a scaled output signal. A current transducer located at the high voltage end includes a coil for sensing current flow in the transmission line and for producing a time derivative output signal. An electrostatic shield connected to the electrically conductive case provides electrostatic shielding of the coil. A low pass filter, connected to the transducer and to the input of the electrically conductive case, filters out electrical noise while an integrating and scaling circuit, located in the case, receives the output of the low pass filter and converts the time derivative signal into a scaled signal corresponding to the scaled output signal provided at the low voltage end.

7 Claims, 2 Drawing Sheets

1

HIGH CURRENT MEASUREMENT SYSTEM INCORPORATING AN AIR-CORE TRANSDUCER

BACKGROUND OF THE INVENTION

1. Field of the Invention

The present invention relates to devices used to measure current flowing through high voltage electrical power transmission lines.

2. Related Art

The measurement of high currents present in power transmission lines has previously been accomplished with devices which use iron-core transformers. The winding ratio is chosen so that the large primary current is converted to a proportional smaller secondary current. The use of iron-core transformers has a number of disadvantages including the weight of such transformers and the difficulty involved, and time required, in installation. A further important disadvantage is that iron-core transformers have an inherent saturation point. At the saturation point, the magnetic flux density in the iron core does not maintain a linear relationship with the primary current, and, as a result, the secondary current is not proportional to the primary current. An accurate measurement of the primary current cannot be accomplished when the secondary current is not proportional to the primary current.

In order to avoid the limitations associated with iron-core transformers, some devices have used air-core transducers, such as Rogowski coils. One particular advantage of air-core transducers is the elimination of saturation problems. Saturation can not occur in air-core transducers. The physics of air-core transducers are such that the output of the coil is a voltage which is proportional to the time derivative of the primary current. As a result, one limitation of conventional devices which incorporate air-core transducers is that an integration operation must be performed before the magnitude and phase of the primary current can be determined. The integration operation has been performed in two locations.

Any electronics mounted electrically close to the power transmission line (the source end) requires a power source. When the integration operation is performed at the source end, additional power is required to power the integration circuits. Another approach has been to perform the integration operation at a location where the metering equipment is located (the remote end) to eliminate the additional power required for the integration operation at the source end. However, when the integration operation is performed at the remote end, the link connecting the source end and the remote end must have a very wide frequency bandwidth and a large voltage dynamic range. One skilled in the art will appreciate that equipment having a wide bandwidth and large dynamic range is inherently more susceptible to electrical noise effects than other equipment.

SUMMARY OF THE INVENTION

In accordance with the invention, an air-core current transducer measurement system is provided which overcomes the problems associated with both iron-core current transformers and conventional air-core current transducers and which combines the advantages associated with conventional air-core current transducers (e.g., ease of installation, no saturation under overload, and small size and weight) with the permanent installation advantages of iron-core current transformers. The measurement system of the invention is particularly useful, inter alia, in providing alternating current measurements at specific locations in a power system and, more generally, in connection with metering and protective systems for electrical power equipment.

According to the invention, an air-core current transducer measurement system is is provided for measuring current flow in a high voltage electrical conductor such as transmission line, the system comprising: a high voltage end including an electrically conductive case for shielding the electrical circuitry at that end and an isolated low voltage end coupled to the high voltage end and providing a scaled output representing the current flow in the high voltage electrical conductor. A current transducer located at the high voltage end includes a coil for sensing current flow in the conductor or transmission line and produces a time derivative output signal. An electrostatic shield connected to the conductive case provides electrostatic shielding of the coil. A low pass filter, connected to the coil and to the input of electrically conductive case, filters out electrical noise. An integrator, located in the conductive case, converts the time derivative signal into a scaled signal corresponding to the scaled output signal provided at the low voltage end.

Preferably, the high voltage end and low voltage end are connected together by a fiber optic cable. Advantageously, the conductive case further includes a signal converter for converting the signal produced by the integrator into a light signal for transmission over the fiber optic cable. The air-core transducer measurement system preferably further comprises a light signal converter at said low-voltage end for converting the light signal into the scaled output signal.

In an advantageous implementation, a laser is located at the low voltage end, a photovoltaic power supply is located at the high voltage end for supplying electrical energy to the integrator and the signal converter, and a fiber optic cable couples the laser to the photovoltaic power supply. A laser power safety interlock circuit is preferably provided for removing power from the laser when a predetermined fault condition occurs. Advantageously, the interlock circuit receives as an input the light signal produced by the signal converter.

The current transducer preferably comprises a Rogowski coil, a torroidal coil with a core material with a relative permeability of approximately unity. The integrator typically comprises an analog integrator, although the integrator can also be implemented digitally.

Other features and advantages of the invention will be set forth in, or apparent from, the following detailed description of the preferred embodiments of the invention.

DESCRIPTION OF THE PREFERRED EMBODIMENTS

Figure 1:
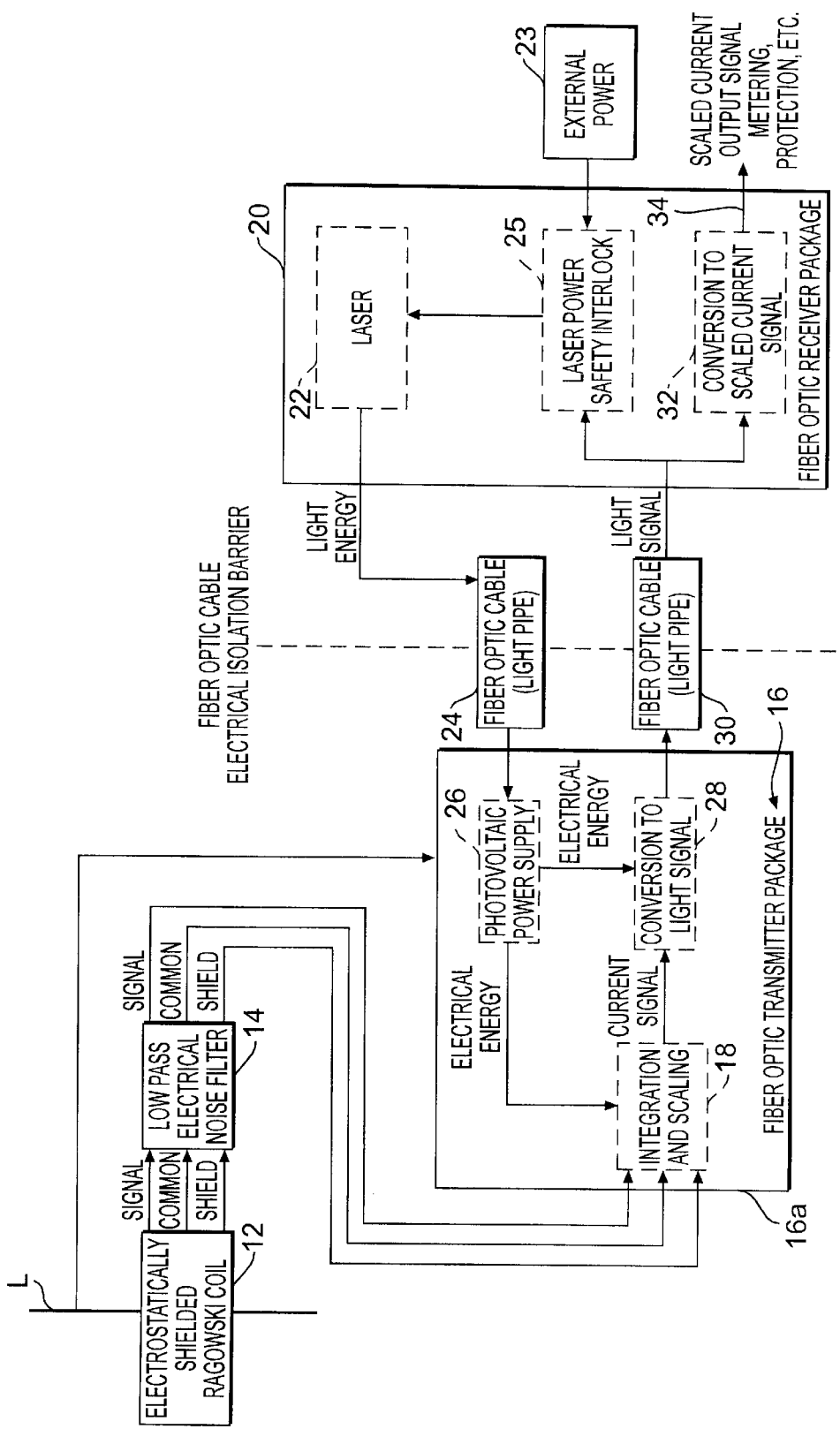
FIG. 1 is a schematic block diagram of a device in accordance with a preferred embodiment of the invention for measuring current flowing through a high voltage electrical power transmission line or other high voltage conductor.
Figure 2:
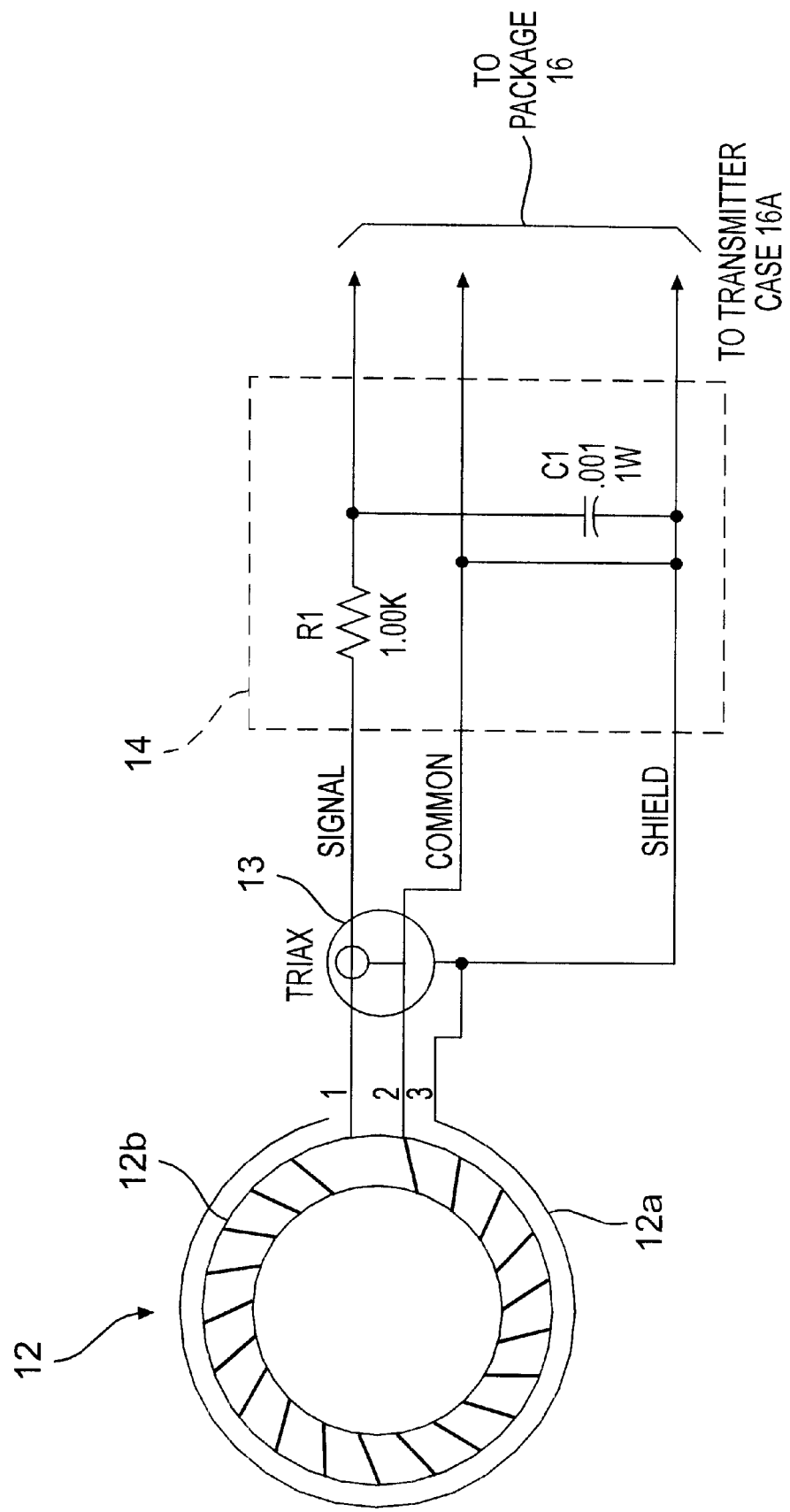
FIG. 2 is a schematic circuit diagram of a portion of the device of FIG. 1.

Referring to FIG. 1, there is shown a device which is denoted 10 and which is constructed in accordance with a first preferred embodiment of the invention for measuring current flowing through a current carrying conductor represented by a high voltage electrical power transmission line L. A Rogowski coil 12 is placed around the power transmission line L and acts as a transducer, with the voltage $V_{in}$ induced therein being proportional to the rate of change of the current in the transmission line L. In particular, $$V_{in}=k*di/dt$$

where k is a constant and di/dt is the first derivative with respect to time of the magnitude of the current in the transmission line L. As indicated in FIG. 1, the Rogowski coil 12 is electrostatically shielded. The electrostatic shield is shown at 12a in FIG. 2 (with the Rogowski coil being shown at 12b) and is designed to provide complete electrostatic shielding without becoming an electrically shorted turn of the coil 12. As is also indicated in FIG. 2, the shield 12a is connected to an electrically conductive case 16a at the high-potential end of the link, which case is connected to transmission line L.

The output of the Rogowski coil 12 passes through a low pass filter 14 which filters out high frequency electrical noise. This connection made through a shielded cable, such as a triax 13, as shown in FIG. 2. In FIG. 2, low pass filter 14 is formed by a series resistor R1 and a shunt capacitor C1 having the values indicated although as will be apparent to those skilled in the art, low pass filter 14 can be of any suitable design and construction of a suitable filter would be well within the skill of those of ordinary skill in the art.

The output of the low pass filter 14 is connected to a fiber optic transmitter package 16. The fiber optic transmitter package 16 is located close to the transmission line L and includes an integrating and scaling circuit 18 at the input end to which filter 14 is connected. Transmitter package 16 includes the electrically conductive case 16a to which electrostatic shield 12a is connected, as described above. The voltage $V_{in}$ induced in the Rogowski coil 12 must be integrated in order to produce a voltage proportional to the current in transmission line L. $V_{in}$ is integrated and scaled by integrating and scaling circuit 18 to produce a signal waveform which is a scaled representation of the current in transmission line L. The remaining units of the fiber optic transmitter package 20 are discussed below. The integrating and scaling circuit 18 can employ an analog integrator or can be implemented digitally.

A fiber optic receiver package 20, which is sited at a location remote from the transmission line L, includes a laser 22 that produces the energy that is used to power integration and scaling circuit 18. An electrical power supply 23 is used to provide power to laser 22, through a laser power safety interlock circuit 25. Laser power interlock circuit 25 is described in more detail below. Laser 22 produces a laser beam which travels through a fiber optic cable 24 to a photovoltaic power supply 26. The photovoltaic power supply 26 is a device used to convert laser energy into electrical energy. The electrical energy output of photovoltaic power supply 26 powers the integration and scaling circuit 18.

The output of integration and scaling circuit 18 is connected to a light conversion circuit 28, which converts the electrical signal from circuit 18 into a light signal, such as a laser or other light beam. Power for light conversion circuit 28 is also supplied by photovoltaic power supply 26. The light signal produced by light conversion circuit 28 travels through a fiber optic cable 30 to an electrical conversion circuit or converter 32 in the fiber optic receiver package 20. The electrical conversion circuit 32 transforms the light signal input into an electrical signal. The electrical signal leaves the fiber optic receiver package 20 at an output port 34. The electrical signal at the output port 34 is a signal (analog or digital) proportional to the current in transmission line L and may be connected to a meter, a protection device or another electrical device or devices.

The light signal which travels through fiber optic cable 30 is also an input to the laser power safety interlock circuit 25. Laser power interlock circuit 25 monitors the light signal and removes power from laser 22 when a malfunction in the system occurs.

Fiber optic transmitter package 16 and fiber optic receiver package 20 can be separated by great distances and are only connected to each other by relatively small and lightweight fiber optic cables 24 and 30. Thus, a fiber optic cable electrical isolation barrier is created.

Although the invention has been described in detail with respect to preferred embodiments thereof, it will be apparent to those skilled in the art that variations and modifications can be effected in these embodiments without departing from the spirit and scope of the invention.

What is claimed:

1. An air core current transducer measurement system for measuring current flow in a high voltage electrical conductor, said system having a high voltage end and a low voltage end and comprising:

at said high voltage end, an electrically conductive case; an air-core current transducer, including a coil, for sensing current flow in the high voltage electrical conductor and for producing a time derivative output signal related to the current flow sensed by the current transducer; an electrostatic shield connected to said case for shielding said coil; a low pass filter, connected to said current transducer, for filtering out electrical noise contained in said time derivative output signal; an integration and scaling circuit, located in said case and connected to said low pass filter for converting said time derivative signal into a scaled signal; and an electrical-optical converter for converting said scaled signal into a corresponding light signal; and at said low voltage end, an optical-electrical converter, electrically isolated from and optically coupled to said integration and scaling circuit through said electrical-optical converter, for converting said light signal into a corresponding scaled current output signal.

2. An air-core current transducer measurement system according to claim 1 wherein said high voltage end and low voltage end are connected together by a fiber optic cable.

3. An air-core current transducer measurement system according to claim 2 further comprising a laser located at said low voltage end, a photovoltaic power supply located at said high voltage end for supplying electrical energy to said integration and scaling circuit and said electrical-optical converter, and a further fiber optic cable coupling said laser to said photovoltaic power supply.

4. An air-core current transducer measurement system according to claim 3 further comprising a laser safety interlock circuit connected to said laser and to said electrical-optical converter for removing power from said laser when a predetermined fault condition occurs.

5. An air-core current transducer measurement system according to claim 1 wherein said current transducer comprises a Rogowski coil.

6. An air-core current transducer measurement system according to claim 1 wherein said integration and scaling circuit includes an analog integrator.

7. An air-core current transducer measurement system according to claim 1 wherein said integration circuit includes a digital integrator.

* * * * *